(12) United States Patent
Bruno

(10) Patent No.: US 7,493,222 B2
(45) Date of Patent: Feb. 17, 2009

(54) HIGH DENSITY METERING SYSTEM

(75) Inventor: David A. Bruno, Portland, OR (US)

(73) Assignee: Veris Industries, LLC, Portland, OR (US)

(*) Notice: Subject to any disclaimer, the term of this patent is extended or adjusted under 35 U.S.C. 154(b) by 124 days.

(21) Appl. No.: 11/521,994

(22) Filed: Sep. 14, 2006

(65) Prior Publication Data

US 2007/0069715 A1  Mar. 29, 2007

Related U.S. Application Data

(60) Provisional application No. 60/719,757, filed on Sep. 22, 2005.

(51) Int. Cl.
*G01R 11/32* (2006.01)

(52) U.S. Cl. .................. 702/64; 702/79; 702/91; 324/142; 340/870.02

(58) Field of Classification Search ............ 702/79, 702/91; 324/117 R, 142, 76.11; 363/20; 340/870.28, 870.02; 320/109
See application file for complete search history.

(56) References Cited

U.S. PATENT DOCUMENTS

| | | | | |
|---|---|---|---|---|
| 4,492,919 A | * | 1/1985 | Milkovic | 324/127 |
| 4,758,774 A | * | 7/1988 | Crawford et al. | 324/726 |
| 5,006,846 A | * | 4/1991 | Granville et al. | 340/870.28 |
| 5,181,026 A | * | 1/1993 | Granville | 340/870.28 |
| 5,365,462 A | * | 11/1994 | McBean, Sr. | 702/91 |
| 5,377,128 A | * | 12/1994 | McBean | 702/91 |
| 5,994,892 A | * | 11/1999 | Turino et al. | 324/142 |
| 7,274,187 B2 | * | 9/2007 | Loy | 324/142 |
| 7,282,889 B2 | * | 10/2007 | Freed et al. | 320/108 |
| 2006/0103548 A1 | * | 5/2006 | Borkowski et al. | 340/870.02 |
| 2006/0181242 A1 | * | 8/2006 | Freed et al. | 320/109 |

* cited by examiner

*Primary Examiner*—Carol S Tsai
(74) *Attorney, Agent, or Firm*—Chernoff, Vilhauer, McClung & Stenzel

(57) ABSTRACT

A modular metering system comprises a data processing module, a current module and a voltage module. The current and voltage modules include sensor memories characterizing the respective current and voltage sensors facilitating assembly and repair of the metering system.

11 Claims, 7 Drawing Sheets

HIGH DENSITY METERING SYSTEM

CROSS-REFERENCE TO RELATED APPLICATIONS

This application claims the benefit of U.S. Provisional App. No. 60/719,757, filed Sep. 22, 2005.

BACKGROUND OF THE INVENTION

The present invention relates to a metering system and, more particularly, to a modular system for measuring electricity consumption by a plurality of loads.

Electric power is typically generated at a remote, central generating facility and transmitted to the consumer over a distribution grid. To reduce transportation losses, a step-up, sub-transmission transformer is used to increase the voltage and reduce the current for transmission over the transmission lines of the distribution grid. The actual transmission line voltage usually depends on the distance between the sub-transmission transformers and the consumers of the electricity but is commonly in the range of 2-35 kilo-volts ("kV"). Distribution substation transformers and distribution transformers of a utility's secondary power distribution system reduce the voltage from the transmission line level to a distribution voltage for delivery and use by industrial, commercial, and residential consumers. In the United States, for example, electric power is typically delivered to a facility as a 60 Hertz (Hz), alternating current (AC) voltage ranging from 120-660 volts ("V"), depending upon the use.

While the total power consumption of a building or other facility is monitored by the electric utility with a power meter located between the distribution transformer and the facility's power distribution panel, in many circumstances, particularly in business environments, it is desirable to monitor the power consumption of individual loads or groups of loads, such as motors, lighting, heating units, cooling units, machinery, etc. or to sub-meter or attribute the facility's power usage and cost to different occupancies, buildings, departments, or cost centers within the facility. These loads are typically connected to one or more of the branch circuits that extend from the power distribution panel and each may be supplied with single phase or multi-phase power. In addition, it is often desirable to monitor several parameters related to efficient electric power distribution and consumption, such as active power, the time rate of transferring or transforming energy; the apparent power, the product of the root mean square (RMS) voltage and current; and the reactive power, the product of the RMS voltage and the quadrature component of the current. Flexibility has favored adoption of digital power meters incorporating data processing systems that can monitor a plurality of circuits and calculate the desired output parameters.

As generated, the fundamental AC voltage and current of the U.S. power grid approximate in-phase, 60 Hertz ("Hz") sine waves over time. The effective or true power of the analog sinusoidal voltage and current waveforms is the integral of the product of the instantaneous magnitudes of the voltage and current averaged over a time period, usually a cycle of the waveform:

$$P = \frac{1}{T}\int_0^T (v(t)i(t))dt \quad (1)$$

where: P=effective or true power (watts)
v(t)=instantaneous voltage at time t
i(t)=instantaneous current at time t
T=time period, typically a waveform cycle period Referring to FIG. 1, in a digital power meter 20 the effective power is typically approximated by averaging the sum of a plurality of products of the instantaneous amplitudes of the voltage and current that are obtained by sampling the voltage and current waveforms at periodic intervals for a period making up at least one cycle of a waveform:

$$P \cong \frac{1}{T}\sum_{k=1}^{k=\frac{T}{\Delta t}} v(k)i(k)\Delta t \quad (2)$$

where: P=effective power
v(k)=sample voltage for the k-th sample, for example voltage 24
i(k)=sample current for the k-th sample, for example current 26
Δt=sampling interval A digital power meter 20 comprises, generally, at least one voltage transducer 22, at least one current transducer 28, voltage and current sampling units 30, 32 and a data processing unit 34 to control the sampling units, read the instantaneous magnitudes of the voltage and current, and calculate the power and other output parameters from a plurality of voltage and current sample values.

The voltage transducer 22 is commonly a voltage divider network that is connected to the conductor in which the voltage will be measured. The exemplary power meter 20 includes three voltage transducers 22, 24, 26 each connected to a bus bar 36, 38, 40 in a power distribution panel 42. Each of the bus bars conducts a single phase of the three-phase power delivered to the power distribution panel from the supply 44, typically the distribution transformer supplying the facility. The power distribution panel provides a convenient location for connecting the voltage transducers because the voltage and phase is the same for all loads attached to a bus bar and interconnection of the transducer and the facility's wiring is facilitated by the wiring connections in the power distribution panel. However, the voltage transducer(s) can be interconnected anywhere in the wiring connecting the supply and the load, including connection at the terminals of a load, for example, terminals 46, 48, 50 of the exemplary 3-phase load 52 or the terminal of the single-phase load 54.

A current transducer 28 typically comprises a resistor network 56 and an associated current transformer 58 that, when installed, encircles the conductor in which current flow is to be measured. A current transformer comprises a secondary winding 60, typically, comprising multiple turns of conductive wire wrapped around the cross-section of a toroidal core 62. The conductor of the current to be measured is passed through the aperture in the center of the toroidal core and constitutes the primary winding of the transformer. The primary winding has $N_1$ turns (typically, $N_1=1$) and the secondary winding has $N_2$ turns and, thus, the current transformer has a turns ratio (n) of $N_1/N_2$. Current flowing in the primary winding (primary current) induces a secondary voltage and current in the secondary winding which is connected to the resistor network. The magnitude of the primary current can be determined from the amplitude of the voltage at the output of the resistor network.

To measure the power consumed by a load, a current transformer is installed encircling each conductor conducting power to the load. For example, three current transformers are arranged to encircle three conductors 64, 66, 68 connecting the exemplary 3-phase load 52 to the supply 44 and a single current transformer 70 encircles a single conductor 72 connecting the exemplary single-phase load 54 to the supply. (Neutral conductors are not illustrated). Bowman et al., U.S. Pat. No. 6,937,003 B2, discloses a power monitoring system that includes a plurality of current transducers mounted on a common support that maintains a fixed spatial relationship between the current transformers and simplifies installation adjacent to the rows of circuit breakers 16 in the typical power distribution panel. Similarly current transformers 58, 74, 76 of the exemplary power meter system 20 and the associated resistor networks are mounted on a single support structure 78 and connected to the power meter by a ribbon cable 80. On the other hand, the current transducers, for example current transducer 70, may be individual units connected to the power meter by individual wires. A current transformer may have a single piece core or a split core to facilitate encirclement of connected wiring with the toroidal core of the transducer. The current transformer 70 is an example of a split core transformer that is commonly installed proximate a pre-wired load or in a pre-wired power distribution panel.

The digital power metering system includes pluralities of voltage and current transducers and multiplexers 82, 84 sequentially connect respective transducers to respective voltage and current sampling units 30, 32. The sampling units 30, 32 each comprise a sample and hold circuit that periodically holds the output voltage of the respective transducer constant and a quantizer that converts the analog output voltage of the transducer to a digital signal. In the sampling units, time, the independent variable of the sinusoidal waveform equation, is converted from a continuum to a plurality of discrete moments and the concurrent magnitudes of the voltage or current transducer signals are converted to discrete, binary values of finite precision. A clock 86, which may be included in the data processing unit 34, provides a time reference enabling the data processing unit to output at least one sampling signal 88 to trigger the sampling of the voltage and current by the respective sampling units 30, 32.

The outputs of the sampling units are read by the data processing unit 34 which, in a typical digital power meter, comprises at least one microprocessor or digital signal processor (DSP). The data processing unit reads and stores the digital values quantifying the magnitudes of the current and voltage samples and uses the values to calculate the current, voltage, power, and other electrical parameters that are output to a display 90 for immediate viewing or to a communications interface 92 enabling transmission to another data processing system, such as a building management computer, for remote display or further processing, for example formulating instructions to automated building equipment. The digital power meter also includes a memory 94 in which operating instructions for the data processing unit, current and voltage samples, and calculated output are stored.

In addition, accurate measurement of electric power requires compensation for error introduced by the transducers of the power meter. For example, the secondary current of a current transformer is ideally equal to the current in the conductor (the primary winding) divided by the number of turns in the secondary winding. However, magnetization of the core of the transformer produces ratio and phase errors which depend on the magnitude of the current being measured and the configuration of the particular transformer, including factors such as core material and turns ratio. Typically, error compensation factors are ascertained by experimentation with sample transformers of each production batch. Error compensation factors for correcting the calculated output of the meter are also stored in the memory 94 for use by the data processing unit 34.

While initial installation of the digital power meter 20 is simplified by the available choices of current transformers and the simple connections of the voltage and current transducers to the power meter, the power meter's integration makes field repairs, modifications and updating problematic. The power meter is tested and calibrated with a specific set of current and voltage transducers and modification of a meter or replacement of a failed transducer requires recalibration of the power meter. A field repairperson typically does not have the equipment necessary to recalibrate the power meter and store new error correction data or a revised transducer configuration in the power meter's memory. As a result, it may be necessary to install a new calibrated meter or accept inaccurate readings from a meter that has been altered by repair.

What is desired, therefore, is a power meter providing flexible construction, simplified installation and improved serviceability.

DETAILED DESCRIPTION OF PREFERRED EMBODIMENTS

In a digital power meter, the power and other electrical parameters are typically calculated by a data processing system utilizing instantaneous magnitudes of the voltage and current obtained by periodically sampling the analog output of voltage and current transducers. A digital power meter generally comprises at least one, and often several, voltage and current transducers, a sampling unit that momentarily holds the output of the transducers constant and converts the analog magnitudes of the outputs to binary values of finite precision, and a data processing system that reads the magnitudes of the voltage and current samples and calculates the current, voltage, power and other power related parameters from the sample values.

Figure 1:
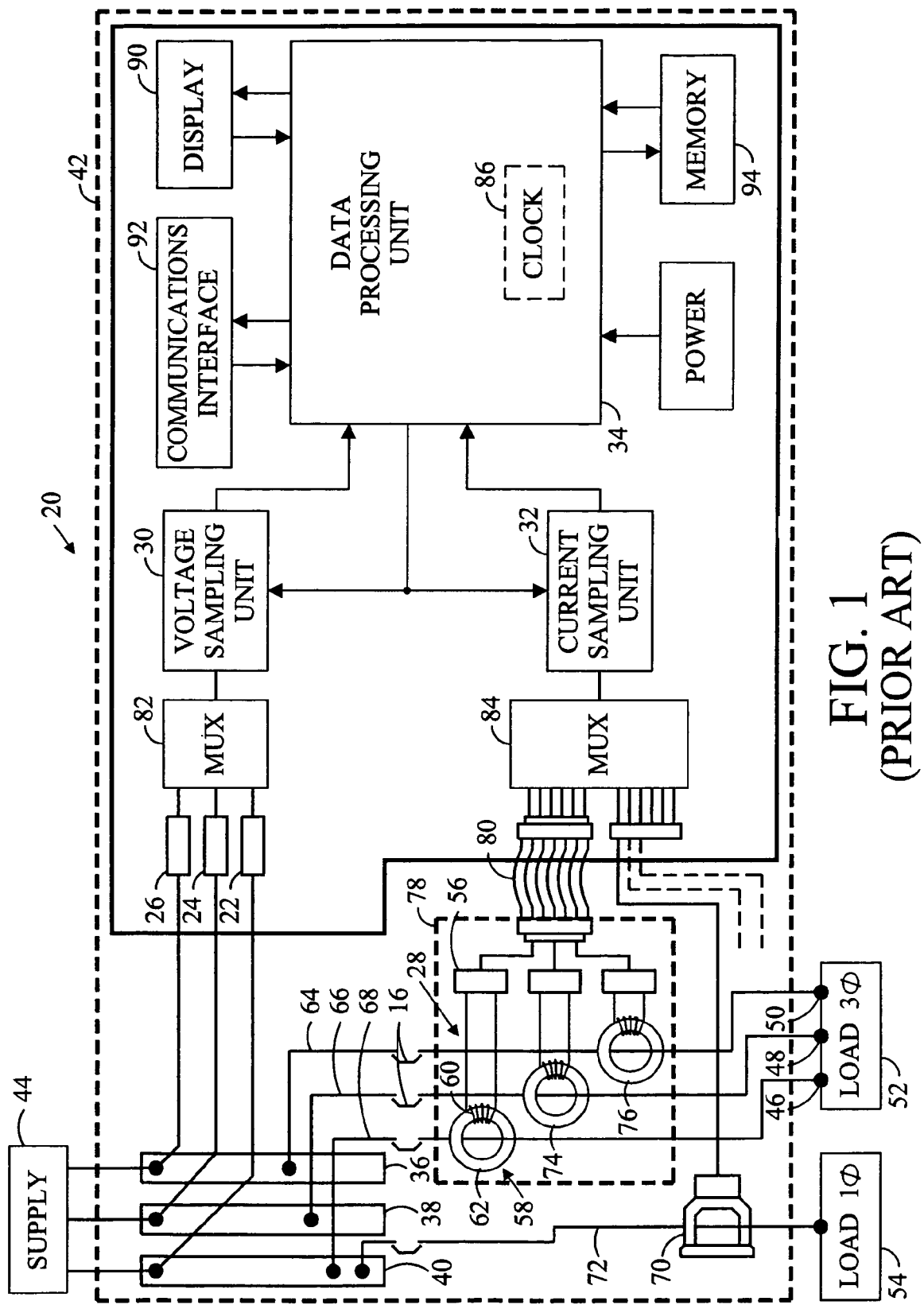
FIG. 1 is a block diagram of an exemplary power meter.

The typical digital power meter is highly integrated with many components aggregated in a single assembly. Referring to FIG. 1, with exception of the current transducers 58, 74, 75, 70, including current transformers which must encircle the respective cables in which current will be measured, all of the major components of the exemplary digital power metering system 20 are incorporated in a single assembly. Moreover, the physical integration of components reflects the interdependent nature of the components of the digital power meter.

The voltage and current transducers of a power meter are useful over limited ranges of voltage and current. For example, a current transducer typically comprises a resistor network and a current transformer. The current transformer comprises a secondary winding in which multiple turns of conductive wire are wrapped around the cross-section of a toroidal core. The conductor, in which the current is to be measured, is passed through the aperture in the center of the toroidal core and comprises the transformer's primary winding. The primary winding has $N_1$ turns (typically, $N_1=1$) and the secondary winding has $N_2$ turns and, thus, the current transformer has a turns ratio (n) of $N_1/N_2$ and, ideally, the current induced in the secondary winding (the secondary current) is equal to the current in the conductor (the primary current) multiplied by the turns ratio.

The maximum current in a conductor of an electrical circuit may be a few amps or a few thousand amps depending upon the electricity's use. Because the turns ratio of a current transformer is generally fixed, the maximum secondary current is equally variable. To protect the meter and to provide accurate metering over the range of currents expected in a conductor, current transformers used with a particular meter are selected so that the secondary current or output voltage of the transducer will be limited to, typically, five amps or one volt, respectively, when the primary current flowing in the conductor is at its maximum magnitude. Likewise, the voltage transducers used in a particular application are selected to produce a specific maximum transducer output at a specified maximum voltage which is less than the maximum voltage expected in the circuit being monitored.

In addition, the transducers of a power meter are not ideal devices and, for accurate metering, the meter must be calibrated with a particular set of transducers. For example, magnetization of the core of a current transformer produces ratio and phase errors which depend upon the magnitude of the current being measured and the configuration of the particular transformer, including factors such as core material and turns ratio. For accurate metering, sample transformers from each production batch are tested with differing burdens to determine error compensation factors to be applied by the data processing system during calculation of the current and other current-based output of the meter. The identities of the transducers, relevant transducer specifications, such as turns ratio, and error compensation factors for the particular set of transducers used in the meter are typically stored in the data processing system's memory 94 for use when calculating the meter's output. The interdependent nature of a power meter's components encourages integration of the meter's circuitry which limits flexibility in meter design and construction and complicates repair and modification of installed meters. For example, the numbers or the specifications of transducers can not readily be changed because the data stored in the data processing unit's memory characterizing the transducers must be updated to reflect the revised configuration and error correction factors. Replacing a current transformer with a transformer of a different production batch may require revising the error correction factors stored in the memory in order to maintain the meter's accuracy. Updating configuration data for a meter is difficult because each meter has its own set of configuration data and, even if the data can downloaded from the meter's manufacturer to the data processing unit's memory, the individualized nature of meters and transducers makes correlating the identity of a meter and its configuration data problematic.

The inventor reasoned that if the transducers of a meter could identify and describe themselves to a data processing system, the data processing system could virtually construct a meter, from the specific components included in the meter, permitting components to be freely added, removed, modified or substituted. The serviceability of the meter would be greatly enhanced by the ability to replace components of installed meters without reprogramming the meter. In addition, a meter with specifications suitable for a particular application could constructed from modular components improving availability and reducing inventory requirements and cost.

Figure 2:
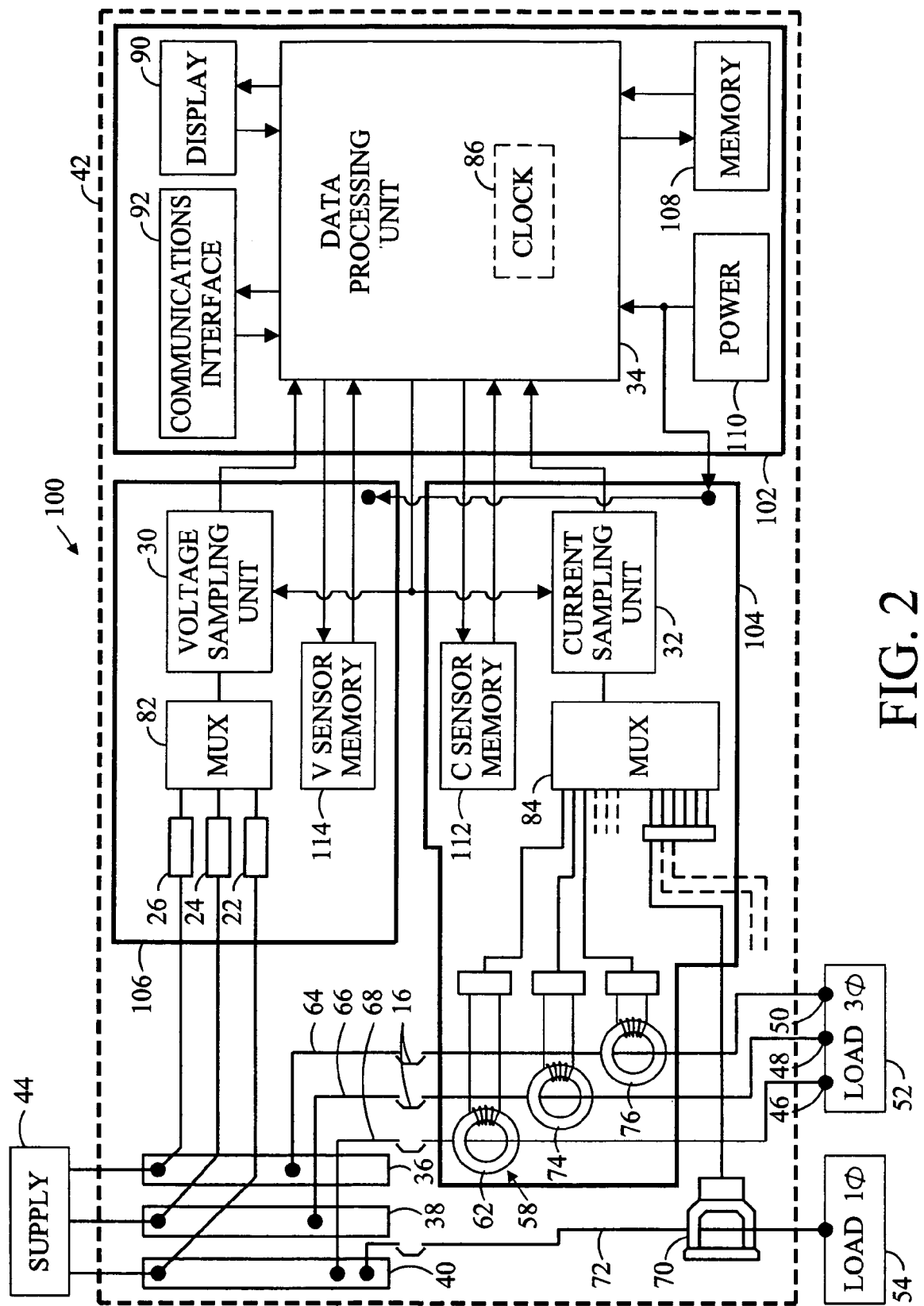
FIG. 2 is a block diagram of an exemplary high density power meter.

Referring in detail to the drawings where similar parts are identified by like reference numerals, and, more particularly to FIG. 2, a high density power meter 100 comprises a data processing module 102, a voltage module 104 and a current module 104. The data processing module 102 comprises a data processing unit 34 which, typically, comprises at least one microprocessor or digital signal processor (DSP). The data processing unit 34 reads and stores digital data received from the voltage module 106 and the current module 104, and uses the voltage and current module data to calculate the current, voltage, power, and other electrical parameters output by the meter. The calculated values may be output to a display 90 for immediate viewing or output to a communications interface 92 for transmission to another data processing system, such a building management computer, for remote display or use in automating or managing building functions. The data processing module 102 may also include a memory 108 in which operating instructions for the data processing unit 34 and meter output data calculated by the data processing unit may be stored. In addition, the data processing module 102 includes a power supply 110 to provide power to the data processing unit and to the voltage and current modules 106, 104.

The current module 104 comprises a current sampling unit 32 and, in most instances, a multiplexer 84. While the current in a single conductor may be monitored with a single current transducer, high density meters typically include a plurality of current transducers enabling monitoring of several circuits. Meters with more than one transducer typically include a multiplexer that sequentially connects the outputs of the respective transducers to the current sampling unit enabling serial sampling of the currents in a plurality of conductors. The current sampling unit 32 comprises a sample and hold circuit and a quantizer. The sample and hold circuit periodically holds the output of a current transducer, connected to the current sampling unit by the multiplexer 84, constant while the quantizer converts the analog output voltage to a digital signal that is transmitted to the data processing unit 34. A clock 86, which may be included in the data processing unit, provides a time signal to the data processing unit which outputs at least one sampling signal 88 to trigger periodic sampling by the current sampling unit.

The current module 104 also includes a current sensor memory 112 in which current transducer characterization data for the current transducers incorporated in the meter are stored. Bruno et al., U.S. Pat. No. 6,825,771, discloses a method and apparatus for identifying a plurality of serially connected transducers on the basis of the propagation of signals in the network of transducers. The characterization data may include transducer identities; relevant specifications, such as turns ratio; and error correction factors, for example to correct for magnetization induced errors. The data processing unit 34 queries the current sensor memory to obtain characterization data including error correction factors and relevant specifications which are used by the data processing unit in calculating the metering system's output.

Figure 3:
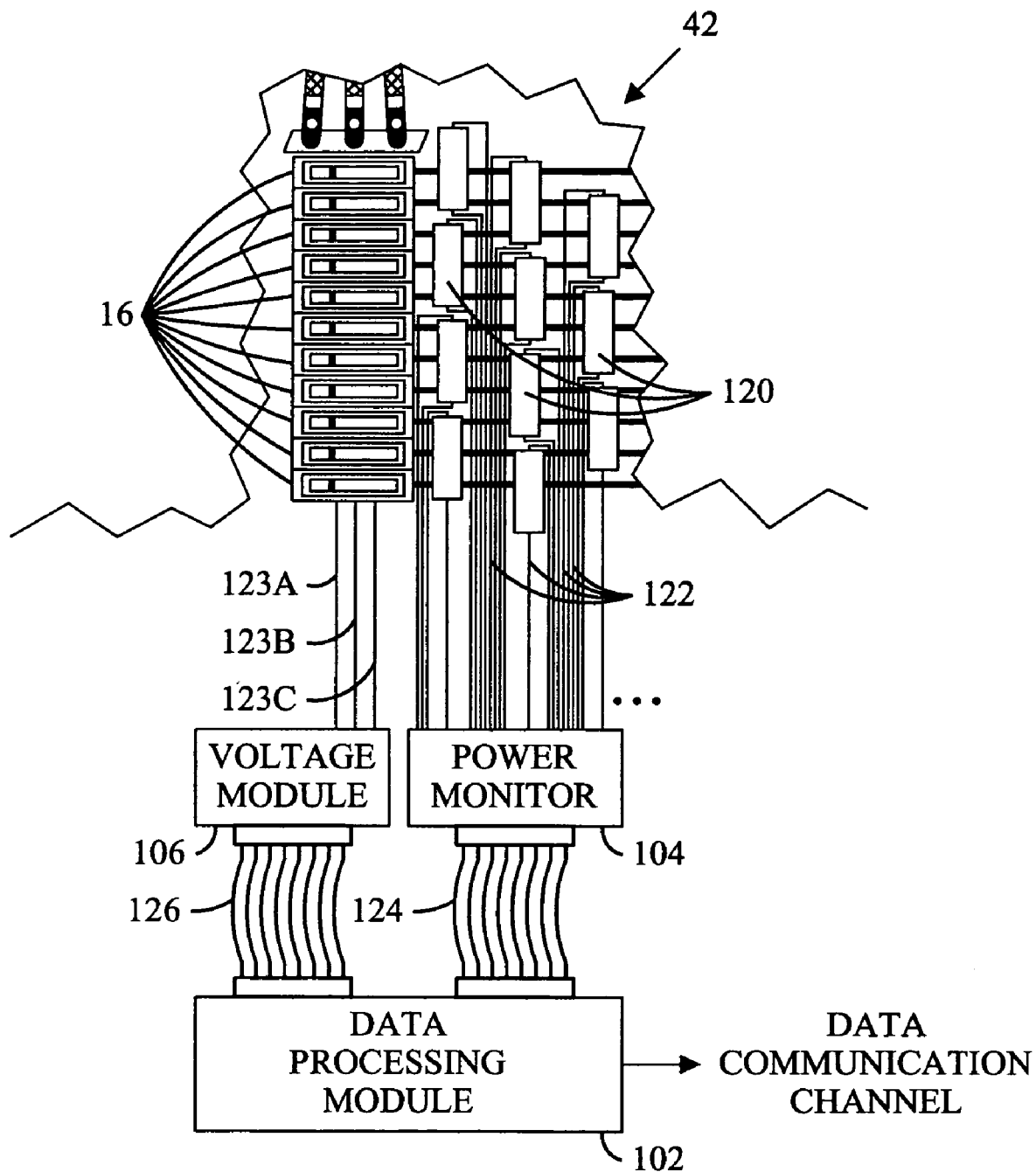
FIG. 3 is a front view of a portion of a power distribution panel including a high density power meter.
Figure 4:
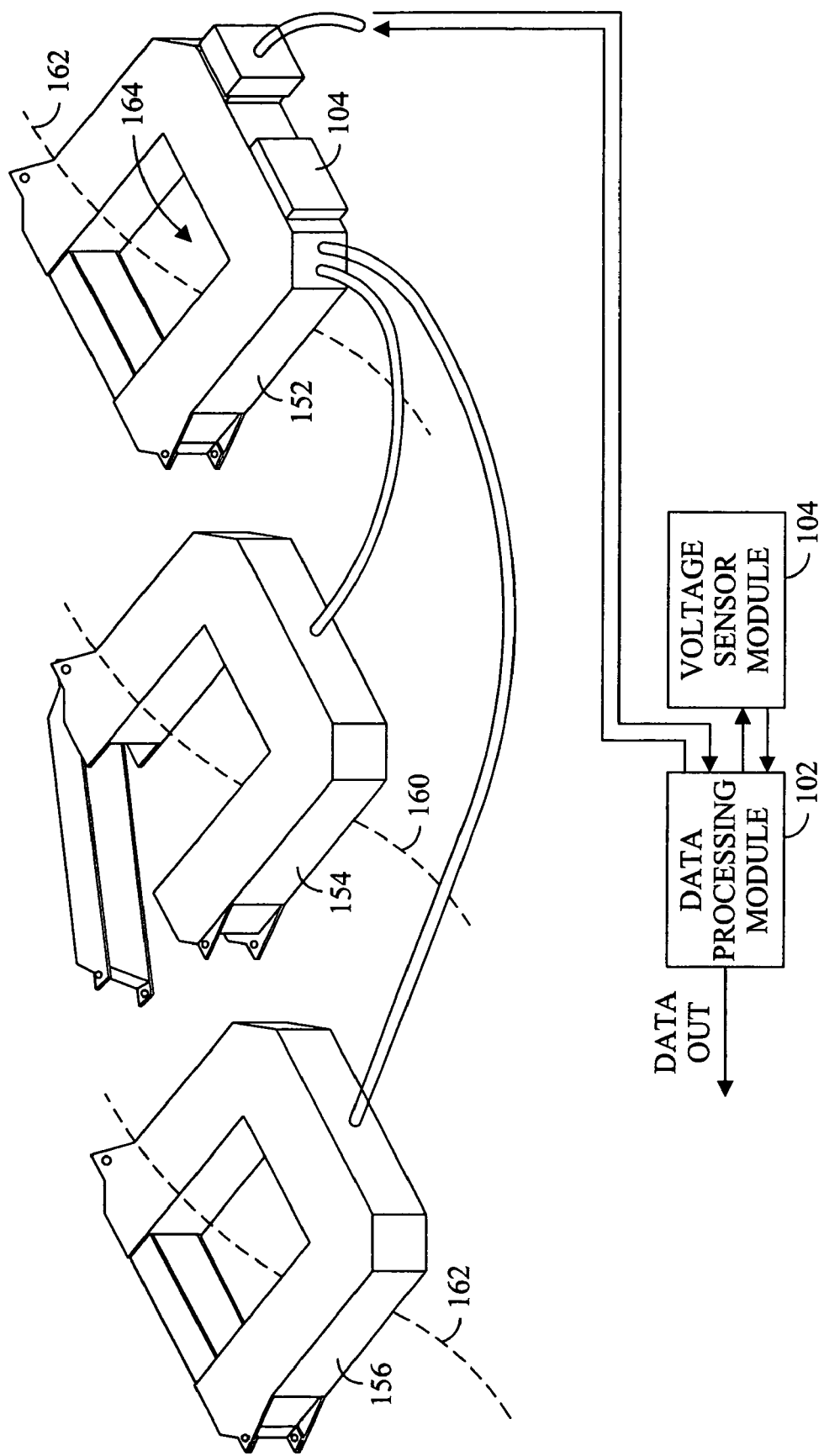
FIG. 4 is a block diagram of a high density power meter for monitoring a 3-phase circuit.

Current sensing may be performed by individual current transformers that are connected to the current module. Referring to FIG. 3, to monitor the current in the branch circuits of a facility, a current transformer 120 is installed on each of the branch circuit conductors connected to a circuit breaker 16 in a power distribution panel 42. Each of the current transformers is connected to the current module 104 by wires 122 and the current module is connected to the data processing module 102 by the ribbon cable 124. Referring to FIG. 4, the current module 104 may be incorporated in one or more of the current transducers 152 of a power metering system 150. In the power metering system 150, three current transducers 152, 154, 156 are arranged to monitor three phase current flowing in three conductors 158,160, 162. The individual current transformers may be split core transformers, as illustrated, or solid core transformers. Split core transformers facilitate routing the conductor through the aperture 164 in the transformer without disconnecting the conductor. A communication link 166 enables current module output data to be transmitted to the data processing module 102 and signals from the data processing module to be transmitted to the current module.

Figure 5:
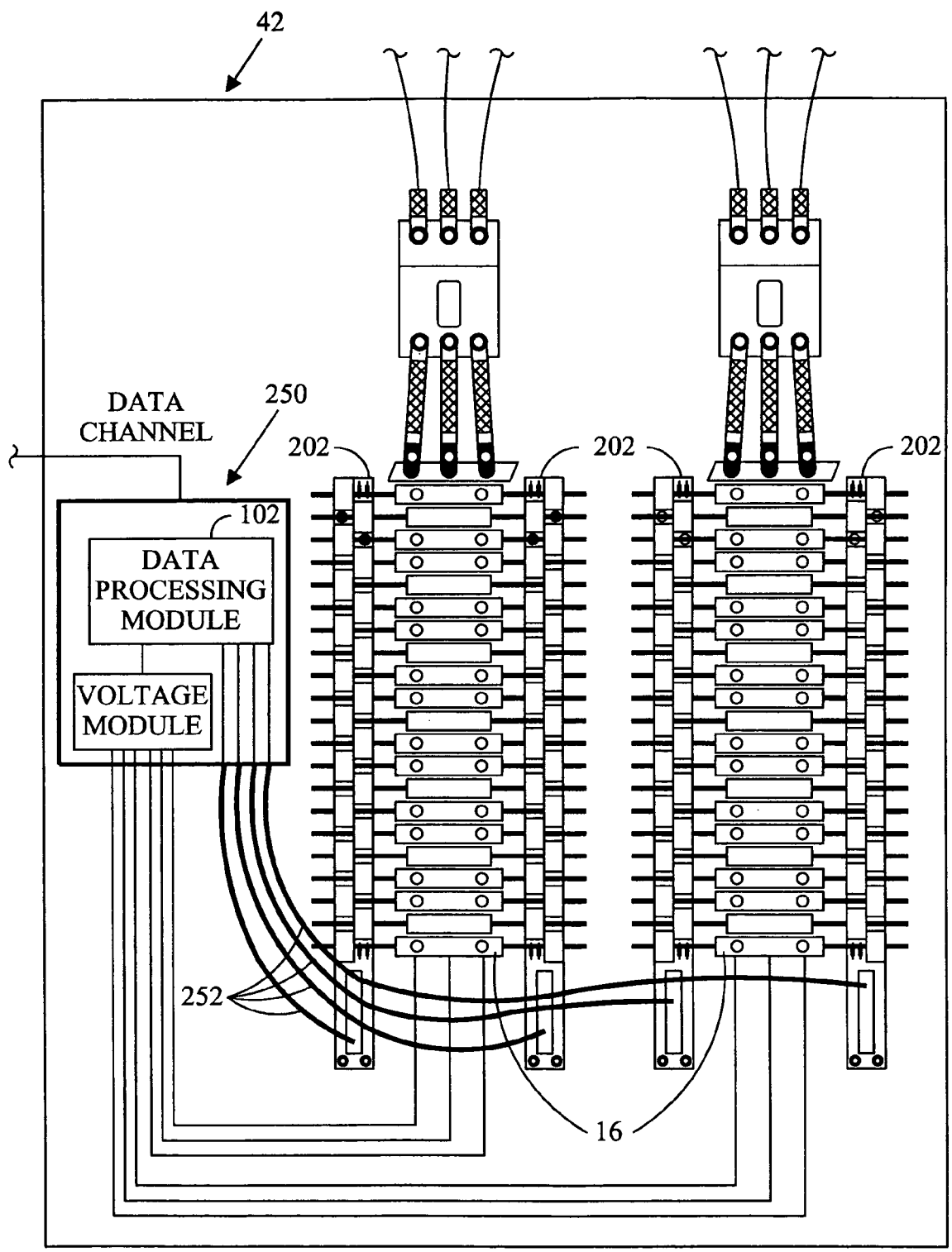
FIG. 5 is a front view of a power distribution panel including a high density power meter having a plurality of current transducers mounted on a common support.
Figure 6:
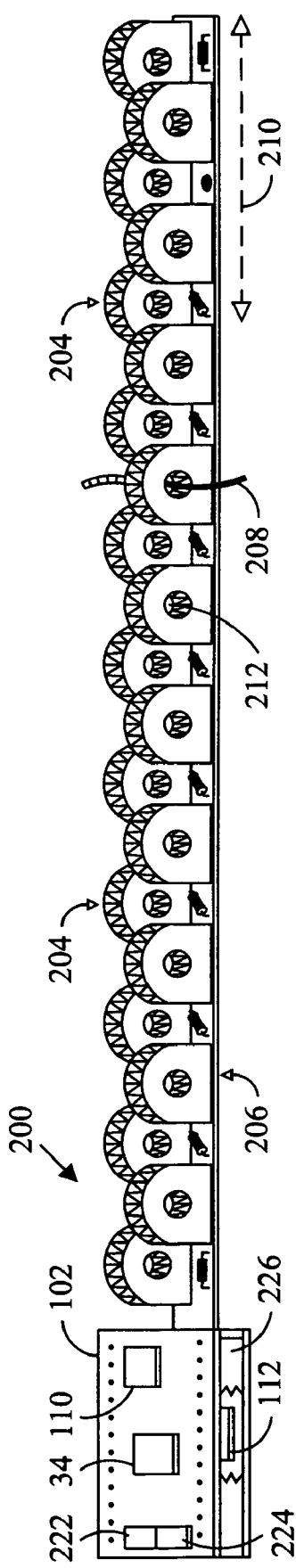
FIG. 6 is a perspective view of a current meter including a current module incorporated in a current transducer strip.
Figure 7:
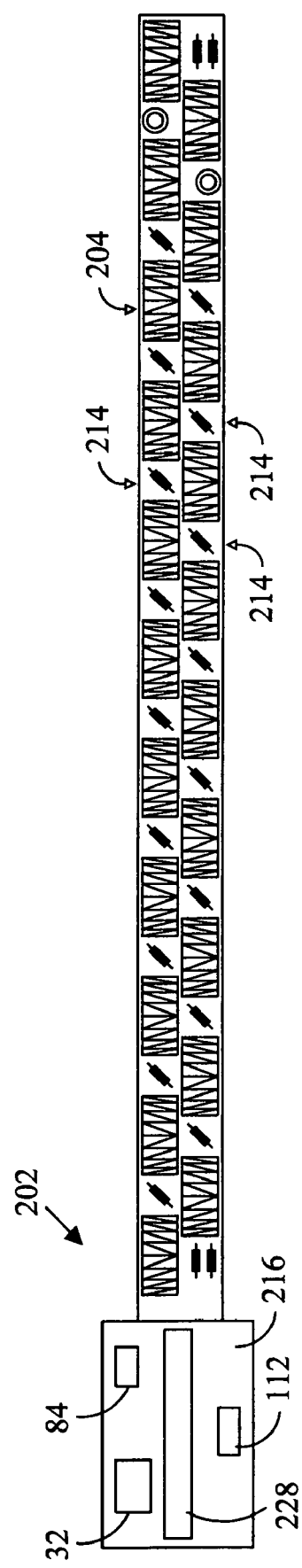
FIG. 7 is a top of a current module incorporated in a current transducer strip.

Bowman et al., U.S. Pat. No. 6,937,003 B2, discloses a power monitoring system for installation in a power distribution panel enclosure that includes sensor strips comprising pluralities of sensors attached to a common support. Referring to FIGS. 5, 6 and 7, the high density power metering system may include one or more sets of sensors 204 that are supported by a common support 206 that maintains a fixed spatial relationship between the sensors. Preferably the support 206 is rigid or semi-rigid, but a flexible support installed on a rigid or a semi-rigid supporting member(s) may likewise be used. The sensors 204 are preferably current transducers, but, alternatively, other types of sensors may be used. The sensors 204 preferably comprise wire wound toroidal coils on a metallic or non-metallic core enclosed within a plastic housing through which a wire 208 may be extended. The openings 212 defined by the toroidal cores of the sensors are preferably oriented substantially parallel to each other and oriented substantially perpendicular to the longitudinal axis 210 of the support 206. For protection from electrical shock, a transient voltage suppressor 214 may be connected in parallel across the output terminals of each sensor to limit the voltage build up at the terminals when the terminals are open circuited. The sensors 204 may be arranged in substantially parallel rows on the support and, to provide a more compact arrangement of sensors, the housings of sensors in adjacent rows may be arranged to partially overlap in the direction of the longitudinal axis of the support 206. Current transformers included on the sensor strip are preferably arranged so that when the strip is installed adjacent to the circuit breakers 16 of a power distribution panel 42 the apertures in the toroidal coils will be aligned directly opposite a branch circuit conductor's connection to the respective circuit breaker to facilitate routing the branch circuit conductor through the core of the respective transformer.

The sensor strip 200 comprises a current module of the high density power meter 250. The multiplexer 84, current sampling unit 32 and current sensor memory 112, in which characterization data for the current transducers included on the sensor strip are stored, are mounted on the support 206. A connector 228 provides a terminus for a communication link 252 connecting the sensor strip 200, the current module, to the data processing module 102.

Referring particularly to FIG. 6, on the other hand, the combination of a data processing module and a current module comprises a current meter. A data processing module 102, including a power supply 110 and a data processing unit 34, may be physically attached and communicatively connected to a current module comprising a strip of sensors 200 by a connector 226. For power calculations, data may be received from a voltage module through a connector 222 mounted on the data processing module 102. Likewise, data may be output to a display or other device through a communications interface comprising a second connector 224 attached to the data processing module.

Figure 8:
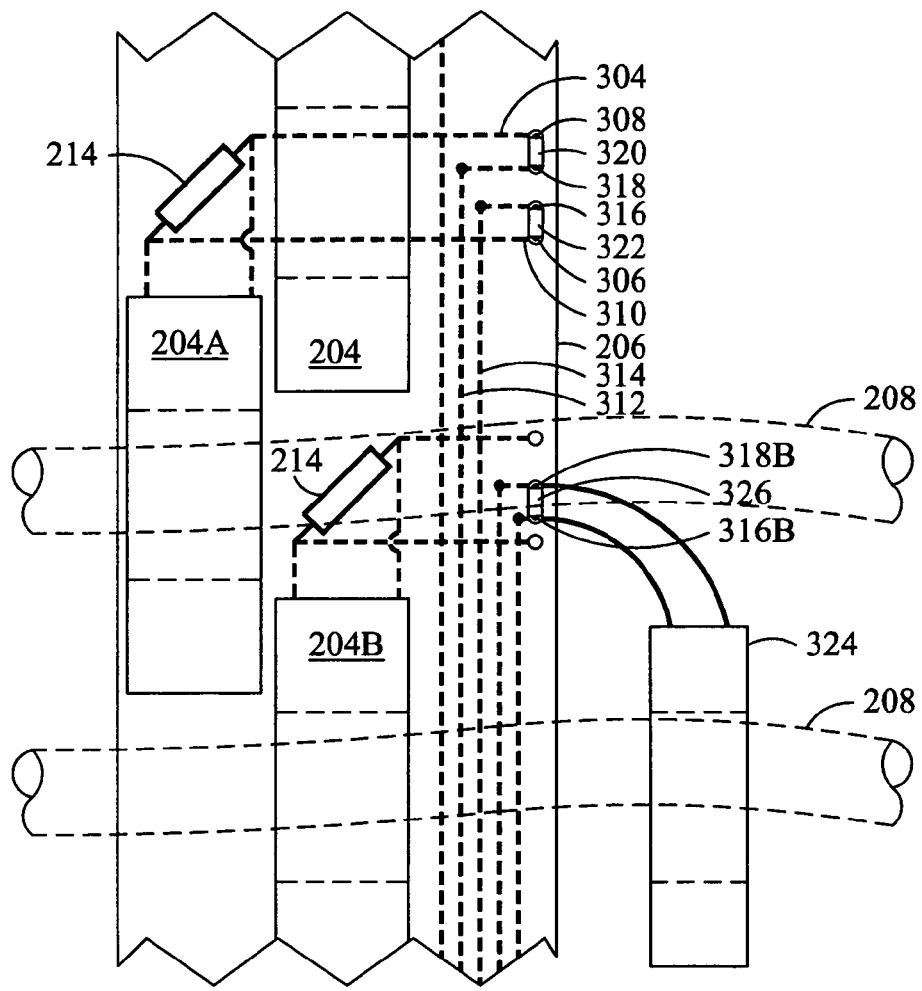
FIG. 8 is a top view of a section of a repairable current transducer strip.
Figure 9:
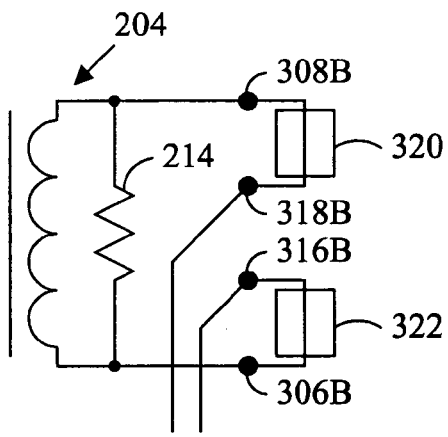
FIG. 9 is a schematic representation of a current transformer of a repairable current transformer strip including connecting jumpers.
Figure 10:
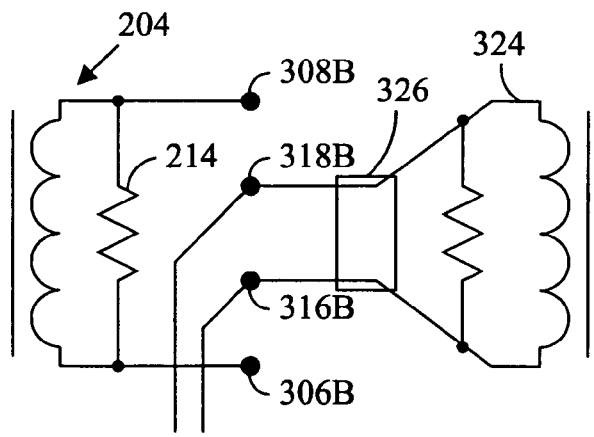
FIG. 10 is a schematic representation of a replacement current transformer installed in a repairable current transformer strip.

While strips of spatially fixed current transducers greatly facilitate installation metering circuitry in power distribution panels, failure of an individual sensor typically requires replacement of the entire sensor strip. The coils of the transformers and the conductive traces that carry the signals from the transformers are encapsulated in the insulating material that comprises the support and a damaged transformer can not be removed from the strip for replacement. Referring to FIGS. 8, 9, and 10, the sensors strips 200, 202 comprise pluralities of transformers 204 mounted on a support 206. A voltage suppressor 214A is connected in parallel with the terminals of the coil of an exemplary current transformer 204A. Conductive traces 304, 306 deposited within the insulating material of the support 206 are conductively connected at one end to the terminals of the voltage suppressor and terminate at the second end in respective tubular conductive vias 308, 310. A second pair of conductive traces 312, 314 terminates in a second pair of tubular conductive vias 316, 318 at one end and at the multiplexer at the second end. The traces 304 and 312 and the traces 306 and 314 are conductively respectively connected by respective conductive jumpers 320, 322 that are inserted into sockets comprising the respective tubular conductive vias. In the event that a transducer, for example transformer 204B, fails, the strip of sensors can be repaired by removing the jumpers installed in the conductive vias 306B, 308B, 316B, 318B and connecting the failed transducer to the multiplexer and installing a replacement transducer 324, for example a split core transducer, having leads that terminate in a plug 326 that corresponds to the conductive socket formed by the conductive vias 316B, 318B.

A current module 104, one or more current transducers and a data processing module 102 comprise a current meter enabling measurement of current in one or more conductors. Likewise, a digital voltmeter can be constructed by combining a data processing module and a voltage module 106. The addition of a voltage module 106 and voltage transducers to a current meter enables voltage sensing by the meter and calculation of power and other parameters based on a combination of voltage and current. The voltage module 106 comprises at least one voltage transducer 22, enabling monitoring of single-phase power, and commonly three voltage transducers 22, 24, 26 for monitoring of 3-phase power. A multiplexer 82 serially connects the voltage transducers to the voltage sampling unit 30. The voltage sampling unit includes a quantizer to convert the analog output voltage of the voltage transducers to a digital value for processing by the data processing unit 34 and a sample and hold section that periodically holds the input to the quantizer constant while the analog to digital conversion proceeds.

The voltage module 106 also includes a voltage sensor memory 114 in which voltage sensor characterization data, including relevant specifications and error correction data, for the voltage transducers is stored. If a portion of the voltage module requires replacement, a new voltage module can be connected to the data processing unit 102. The data processing unit reads the data contained in the voltage sensor memory 114 and applies the sensor characterization data when calculating the voltage from the output data of the replacement voltage module.

The modular construction and storage of current and voltage sensor characterization data in the respective current and voltage modules permits the data processing system to virtually construct the meter from the components that are included in the assembly. Stocking requirements are reduced because voltage and current modules with particular sensor ranges can be included in the meter as required by the application. Further, providing the characterization data with the respective module permits operation of the meter to proceed following assembly, repair or modification without the necessity of reprogramming the data processing unit's memory to accommodate new transducers.

The detailed description, above, sets forth numerous specific details to provide a thorough understanding of the present invention. However, those skilled in the art will appreciate that the present invention may be practiced without these specific details. In other instances, well known methods, procedures, components, and circuitry have not been described in detail to avoid obscuring the present invention.

All the references cited herein are incorporated by reference.

The terms and expressions that have been employed in the foregoing specification are used as terms of description and not of limitation, and there is no intention, in the use of such terms and expressions, of excluding equivalents of the features shown and described or portions thereof, it being recognized that the scope of the invention is defined and limited only by the claims that follow.

I claim:

1. A power meter comprising:
   (a) a data processing module including a data processing unit to calculate a current from an output of a current transducer and a datum characterizing said current transducer; and
   (b) a current module including:
      (i) a current transducer comprising:
         (1) a current transformer affixed to a support;
         (2) a conductor affixed to said support;
         (3) a connector to conductively connect said current transformer and said conductor, said connector removable to disconnect said current transformer from said conductor; and
         (4) if said first current transformer is disconnected from said conductor, a socket conductively connected to said conductor, said socket arranged to receive a conductor of another current transformer; and
      (ii) a current sensor memory storing a datum characterizing said current transducer, said datum readable by said data processing unit, said current module being separate from said data processing module.

2. The power meter of claim 1 wherein said datum characterizing said current transducer comprises a current transformer turns ratio.

3. The power meter of claim 1 wherein said datum characterizing said current transducer comprises a correction for a magnetization induced error.

4. The power meter of claim 1 wherein said current sensor memory is attached to a body of said current transducer.

5. The power meter of claim 1 wherein said data processing module further comprises a power supply providing power to said data processing unit and said current module.

6. The power meter of claim 1 further comprising a voltage module separate from said data processing module and including:
   (a) a voltage transducer; and
   (b) a voltage sensor memory storing a datum characterizing said voltage transducer, said datum readable by said data processing unit and used by said data processing unit to calculate a voltage.

7. The power meter of claim 6 wherein said data processing module further comprises a power supply providing power to said data processing unit, said current module and said voltage module.

8. A power meter comprising:
   (a) a current module including;
      (i) a current sensor memory storing a current sensor characterization datum; and
      (ii) a current transducer comprising:
         (1) a current transformer affixed to a support;
         (2) a conductor affixed to said support;
         (3) a connector to conductively connect said current transformer and said conductor, said connector removable to disconnect said current transformer from said conductor; and
         (4) if said current transformer is disconnected from said conductor, a socket conductively connected to said conductor, said socket arranged to receive a conductor of another current transformer;
   (b) a voltage module including;
      (i) a voltage sensor memory storing a voltage sensor characterization datum; and
      (ii) a voltage transducer; and
   (c) a data processing unit communicatively connected to but separate from said current module and said voltage module to calculate at least one of a current, voltage and power from an output of said current transducer, an output of said voltage transducer, and at least one of said current sensor characterization datum and said voltage sensor characterization datum.

9. The power meter of claim 8 wherein said current sensor characterization datum comprises a current transformer turns ratio.

10. The power meter of claim 8 wherein said current sensor characterization datum comprises a correction for a magnetization induced error.

11. A current sensing apparatus comprising:
   (a) a current transformer affixed to a support;
   (b) a conductor affixed to said support;
   (c) a connector to conductively connect said current transformer and said conductor, said connector removable to disconnect said current transformer from said conductor; and
   (d) if said first current transformer is disconnected from said conductor, a socket conductively connected to said conductor, said socket arranged to receive a conductor of another current transformer.

* * * * *